United States Patent
Iwaya

(10) Patent No.: US 7,652,944 B2
(45) Date of Patent: Jan. 26, 2010

(54) SEMICONDUCTOR DEVICE FOR REDUCING SOFT ERROR RATE WITH REDUCED POWER CONSUMPTION

(75) Inventor: Yuichi Iwaya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 238 days.

(21) Appl. No.: 11/450,267

(22) Filed: Jun. 12, 2006

(65) Prior Publication Data

US 2006/0279318 A1  Dec. 14, 2006

(30) Foreign Application Priority Data

Jun. 13, 2005  (JP)  ............................... 2005-172710

(51) Int. Cl.
*G11C 5/14* (2006.01)
(52) U.S. Cl. ...................... 365/226; 365/227; 713/320; 307/65
(58) Field of Classification Search ................. 365/226, 365/227; 713/320; 307/64, 65, 66, 85, 86, 307/87
See application file for complete search history.

(56) References Cited

U.S. PATENT DOCUMENTS

| | | | | |
|---|---|---|---|---|
| 6,763,471 | B1 * | 7/2004 | Aoyama | 713/320 |
| 7,093,143 | B2 * | 8/2006 | Ito et al. | 713/300 |
| 7,200,054 | B2 * | 4/2007 | Horiguchi et al. | 365/189.11 |
| 2002/0171295 | A1 * | 11/2002 | Nitta et al. | 307/64 |
| 2004/0238939 | A1 * | 12/2004 | Wu | 257/691 |

FOREIGN PATENT DOCUMENTS

JP  5-108193 A  4/1993

* cited by examiner

*Primary Examiner*—Pho M Luu
*Assistant Examiner*—Toan Le
(74) *Attorney, Agent, or Firm*—Sughrue Mion, PLLC

(57) ABSTRACT

A semiconductor device is composed of a first circuit receiving a first power supply voltage; and a second circuit receiving a second power supply voltage. The second power supply voltage is higher than the first power supply voltage. Such device arrangement is effective for reducing the soft error rate, when the second circuit is more susceptive to a soft error than the first circuit, especially when the second circuit is a memory device.

9 Claims, 4 Drawing Sheets

SEMICONDUCTOR DEVICE FOR REDUCING SOFT ERROR RATE WITH REDUCED POWER CONSUMPTION

BACKGROUND OF THE INVENTION

1. Field of the Invention

The present invention relates to semiconductor devices, particularly to soft error reduction in semiconductor devices.

2. Description of the Related Art

Consumer electronic appliances operating on a battery often require reduction in the power consumption of a microcomputer incorporated therein.

As disclosed in Japanese Laid Open Patent Application No. Jp-A Heisei 5-108193, one approach for reducing power consumption of a microcomputer is to reduce the power supply voltage and/or the clock signal frequency, when high speed operation is not required.

FIG. 1 illustrates a typical structure of a microcomputer which adopts the above-described approach. A microcomputer 100 is provided with a voltage control circuit 10, a peripheral circuit 20, a CPU (Central Processing Unit) 30, a RAM (Random Access Memory) 40, a frequency divider circuit 50 and a register 60. The voltage control circuit 10 receives an external power supply voltage VDD0 from a power supply terminal. The peripheral circuit 20, the CPU 30, the RAM 40, the frequency divider circuit 50 and the register 60 are connected to the voltage control circuit 10. The CPU 30 is connected to the frequency divider circuit 50 and the register 60. The frequency divider circuit 50 is connected to a clock terminal to which an external clock CLK0 is supplied.

The microcomputer 100 in FIG. 1 operates as follows: The voltage control circuit 10 feeds an internal power supply voltage to the peripheral circuit 20, the CPU 30, and the RAM 40. The voltage control circuit 10 controls the voltage level of the internal power supply voltage. The internal power supply voltage may have a voltage level identical to that of the external power supply voltage VDD0, or lower than that of the external power supply voltage VDD0. The frequency divider circuit 50 is designed to control the frequency of an internal clock signal fed to the CPU 30. In a certain operation, the frequency of the internal clock signal may be identical to that of the external clock signal CLK0, while the internal clock signal may be generated by frequency-dividing of the external clock CLK0. The operations of the voltage control circuit 10 and the frequency divider circuit 50 are controlled on a value set to the register 60 by the CPU 30. For example, when the value set to the register 60 is "0", the voltage control circuit 10 controls the internal power supply voltage to the same level as the external power source voltage VDD0, and the frequency divider circuit 50 controls the frequency of the internal clock signal to the same frequency as the external clock signal CLK0. When the value of the register 60 is "1", on the other hand, the voltage control circuit 10 generates the internal power supply voltage through stepping down the external power source voltage VDD0, and the frequency divider circuit 50 generates the internal clock signal through frequency-dividing of the external clock signal CLK0. As a result, the operation voltage is controlled in accordance with the operation frequency, and the power consumption is reduced.

One issue of the microcomputer 100 shown in FIG. 1 is an increased soft error rate caused by the reduction of the operation voltage. The "soft error" is a phenomenon that electric charges are generated within a memory cell by an incoming radiation of a cosmic ray, such as, an alpha ray and a neutron ray, and data stored in the memory cell is undesirably destroyed by the generated electric charges. The soft error rate depends on a RAM capacity and a RAM operation voltage. In accordance with an increase in the capacity of the RAM (or the area of the RAM), the possibility also increases that the RAM suffers from a soft error. The reduction in the RAM operation voltage also increases the possibility in which the RAM suffers from a soft error, because the operation voltage reduction is accompanied by reduction in the charges stored in memory cells.

SUMMARY OF THE INVENTION

In an aspect of the present invention, a semiconductor device is composed of a first circuit receiving a first power supply voltage; and a second circuit receiving a second power supply voltage. The second power supply voltage is higher than the first power supply voltage. Such device arrangement is effective for reducing the soft error rate with reduced power consumption, when the first circuit is more tolerant to a soft error than the second circuit (that is, the second circuit is more susceptive to a soft error than the first circuit), especially when the second circuit is a memory device.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1:
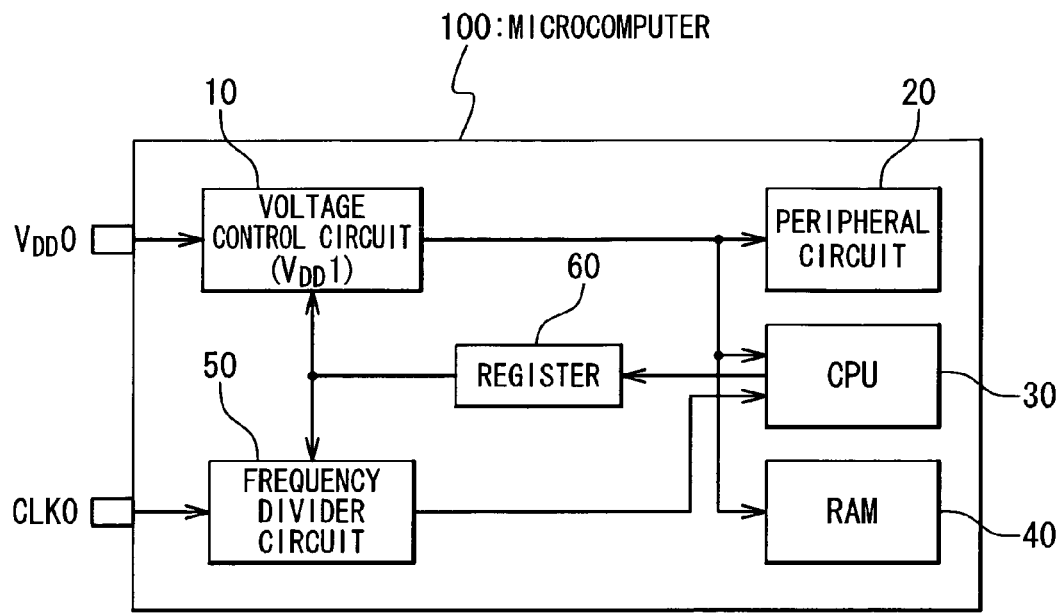
FIG. 1 is a block diagram illustrating the structure of a conventional microcomputer.
Figure 2:
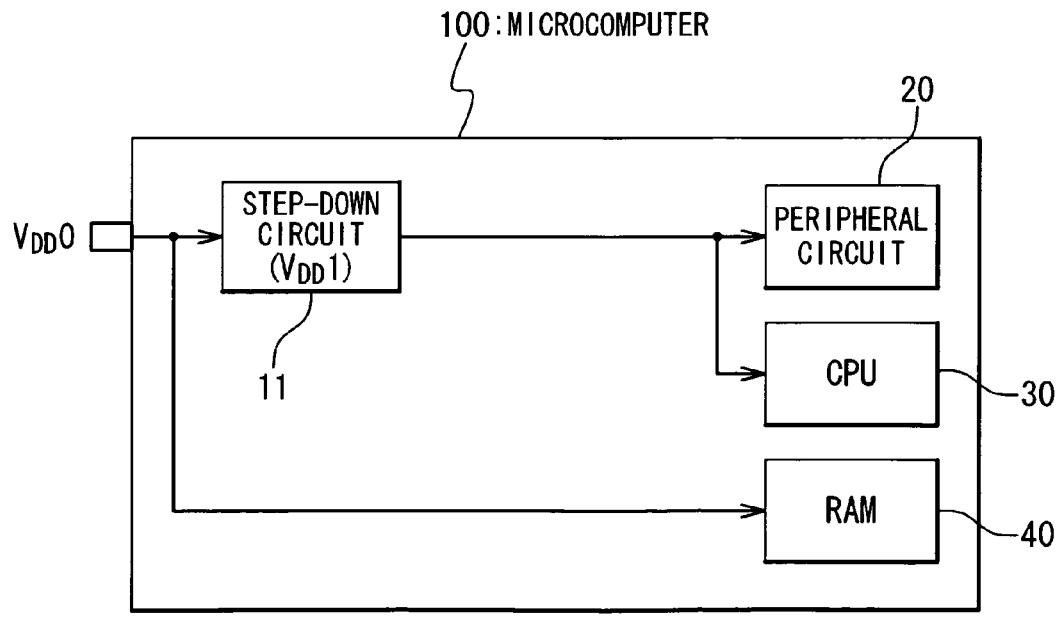
FIG. 2 is a block diagram illustrating the structure of a microcomputer in a first embodiment.

In a first embodiment, as shown in FIG. 2, a microcomputer 100 is provided with a step-down circuit 11, a peripheral circuit 20, and a CPU 30 and a RAM 40. The step-down circuit 11 generates an internal power supply voltage VDD1 by stepping down an external power supply voltage VDD0 fed to the microcomputer 100. The RAM 40 may be any semiconductor memory device. The RAM 40 may be a DRAM, an SRAM, an MRAM (Magnetic RAM), an FeRAM (Ferroelectric RAM), an OUM (Ovonic Unified Memory) and a flash memory. An EEPROM may be used instead of the RAM 40.

The step-down circuit 11 is connected to a power source terminal which receives the external power source voltage VDD0. The peripheral circuit 20 and the CPU 30 are connected to the step-down circuit 11. The RAM 40 is directly connected to the power source terminal; the power supply voltage is fed to the RAM 40 without interfacing with the step-down circuit 11.

The microcomputer 100 in the first embodiment is characterized in that the external power source voltage VDD0 is directly supplied to the RAM 40; the RAM 40 operates on the external power source voltage VDD0, while the CPU 30 and the peripheral circuit 20 operate on the internal power supply voltage VDD1 generated by the step-down circuit 11. It should be noted that the external power supply voltage VDD0 is higher than the internal power supply voltage VDD1.

The architecture shown in FIG. 2, in which a higher power supply voltage is separately fed to the RAM 40 and a lower power supply voltage is fed to other circuits (including the CPU 30 and the peripheral circuit 20), effectively suppresses the soft error while reducing the power consumption. It should be noted that the increase in the voltage fed to the RAM is accompanied by the undesirable increase in the power consumption of other circuits, because the voltage fed to other circuits is also increased.

Figure 3:
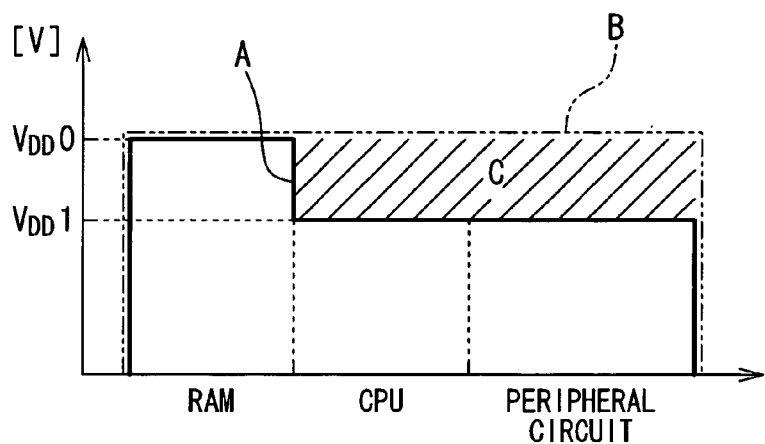
FIG. 3 is a graph illustrating power consumptions of the conventional microcomputer and the microcomputer in the first embodiment.

FIG. 3 schematically illustrates power consumptions of the microcomputer in this embodiment and the conventional microcomputer. The area of the region surrounded by a solid line A represents the power consumption of the microcomputer in this embodiment, while the area of the region surrounded by a broken line B represents the power consumption of the conventional microcomputer operated on the voltage VDD0 so that the soft error does not take place in the RAM. A region C indicated by the hatching represents the power consumption difference. The power difference indicates the effect of the power consumption reduction caused by the microprocessor architecture in this embodiment.

Figure 4:
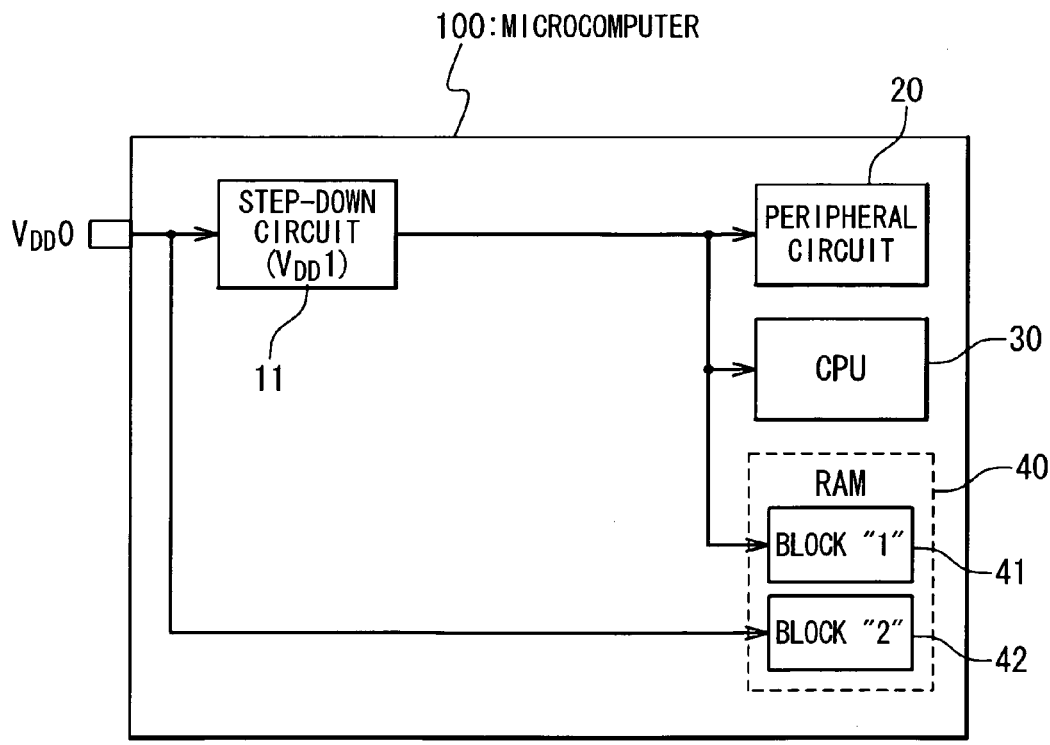
FIG. 4 is a block diagram illustrating the structure of a microcomputer in a second embodiment.

FIG. 4 illustrates the structure of a microprocessor 100 in a second embodiment. The microcomputer 100 is provided with a step-down circuit 11, a peripheral circuit 20, a CPU 30 and a RAM 40. The RAM 40 includes multiple RAM blocks; in this embodiment, the RAM 40 includes two RAM blocks 41 and 42.

The step-down circuit 11 is connected to a power source terminal from which the external power source voltage VDD0 is supplied. The peripheral circuit 20, the CPU 30 and the RAM block 41 are connected to the step-down circuit 11. The RAM block 42 is directly connected to the power supply terminal receiving the external power source voltage VDD0, without interfacing with the step-down circuit 11.

The CPU 30, the peripheral circuit 20, and the RAM block 41 within the RAM 40 operate on the internal power supply voltage VDD1 generated by the step-down circuit 11, while the RAM block 42 operates on the external power supply voltage VDD0 which is higher than the internal power supply voltage VDD1.

The microcomputer 100 in the second embodiment achieves further power consumption reduction compared with the microcomputer 100 in the first embodiment, through operating only the part of the RAM 40 (the RAM block 42 in FIG. 4) on the high power supply voltage VDD0; the remaining parts (the CPU 30, the peripheral circuit 20, and the RAM block 41 in FIG. 4) are operated on the lower power supply voltage VDD1.

Although the RAM block 41, which operates on the lower power supply voltage VDD1, may suffer from the soft error, this problem can be dealt with, by appropriate data allocation. In a preferred embodiment, the RAM block 42 is used to store data which is needed to be stored continuously during the operation of the microcomputer 100, such as system configuration data. When the microcomputer 100 is used in audio hardware, the data stored in the RAM block 42 may include the title and/or file size of the currently-played music. The RAM block 41, on the other hand, is used to store data which is needed to be stored only temporarily, such as temporary data used in arithmetic processing. Such data allocation effectively reduces the probability that a soft error actually causes a problem in the operation of the microcomputer 100. For example, a certain piece of data within the RAM block 41 is destroyed by a soft error, the piece of data is often anymore unnecessary in subsequent operations. Therefore, operating the RAM block 41 on the lower power supply voltage VDD1 does not seriously increase the possibility in actual operations of the microcomputer 100.

Figure 5:
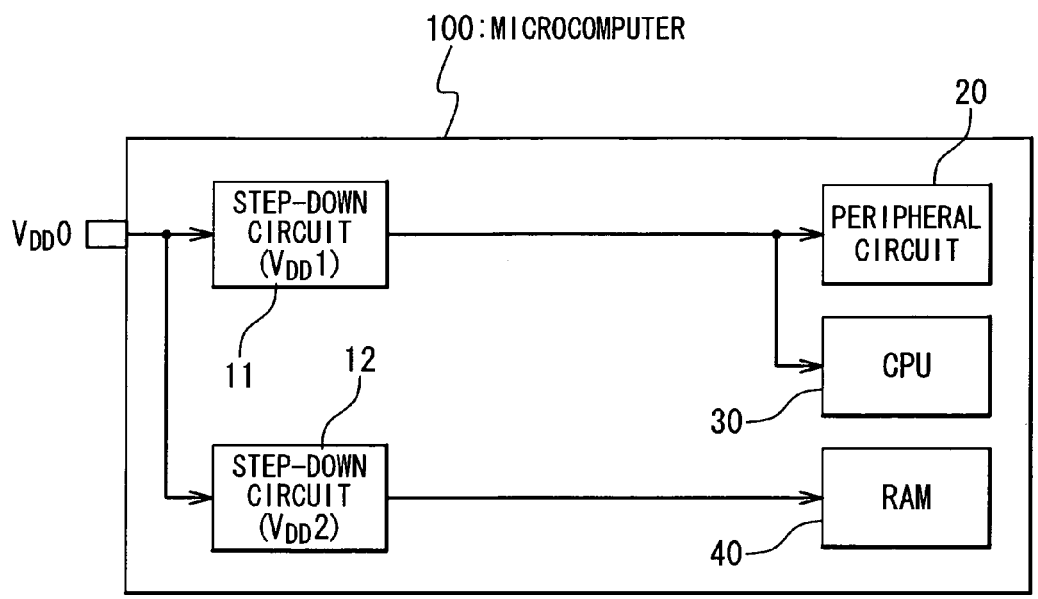
FIG. 5 is a block diagram illustrating the structure of a microcomputer in a third embodiment.

FIG. 5 illustrates the structure of a microcomputer 100 in a third embodiment of the present invention. In this embodiment, a step-down circuit is additionally incorporated within the microcomputer 100 to feed an internal power supply voltage to the RAM 40. Specifically, the microcomputer 100 in the third embodiment is provided with a pair of step-down circuits 11 and 12, a peripheral circuit 20, a CPU 30, and a RAM 40.

The step-down circuits 11 and 12 are commonly connected to a power supply terminal receiving an external power supply voltage VDD0. The peripheral circuit 20 and the CPU 30 are connected to the step-down circuit 11, while the RAM 40 is connected to the step-down circuit 12. The step-down circuit 12 is dedicatedly provided for the RAM 40.

The step-down circuits 11 and 12 generate internal power supply voltages VDD1 and VDD2, respectively, by stepping down the external power supply voltage VDD0. The internal power supply voltage VDD2 generated by the step-down circuit 12 is higher than the internal power supply voltage VDD1 generated by the step-down circuit 11.

In this embodiment, the RAM 40 operates on the higher internal power supply voltage VDD2, generated by the step-down circuit 12, while the CPU 30 and the peripheral circuit 20 operates on the lower internal power supply voltage VDD1. It should be noted that VDD2>VDD1. Feeding the higher internal power supply voltage VDD2 to the RAM 40 effectively avoids the soft error of the RAM 40. One advantage of the microcomputer 100 in this embodiment is reduction in the power consumption of the RAM 40 compared with the first embodiment.

Preferably, the voltage level of the internal power supply voltage VDD2 is adjusted in accordance with the capacity of the RAM 40. When the capacity of the RAM 40 is relatively large, the voltage level of the internal power supply voltage VDD2 is increased. When the capacity of the RAM 40 is relatively small, the voltage level of the internal power supply voltage VDD2 is decreased. This allows reducing the power consumption of the RAM 40 as the capacity of the RAM 40 decreases.

Figure 6:
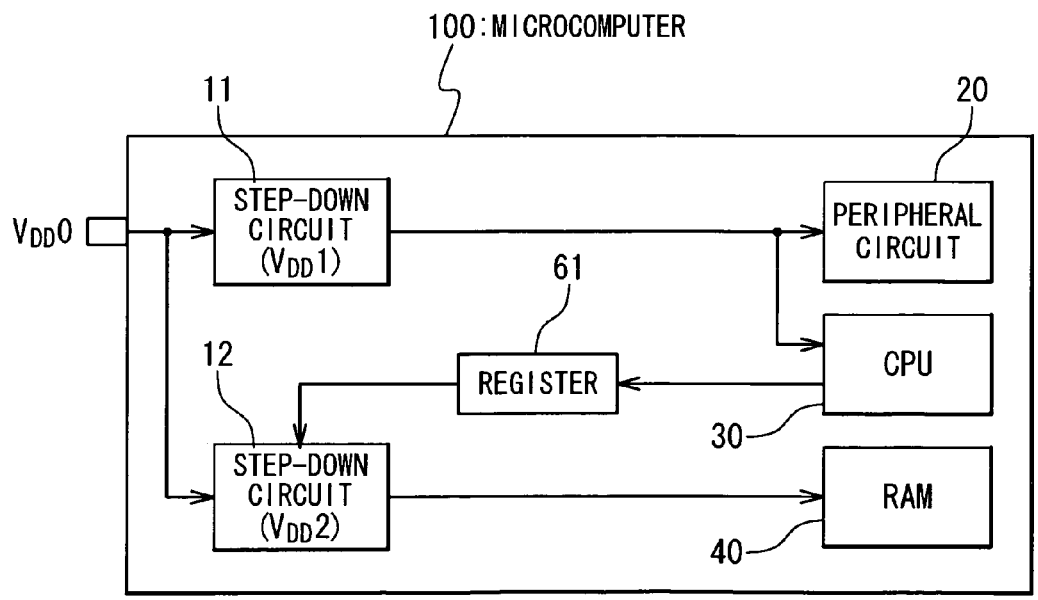
FIG. 6 is a block diagram illustrating the structure of a microcomputer in a fourth embodiment.

FIG. 6 illustrates the structure of a microcomputer 100 in a fifth embodiment of the present invention. The microcomputer 100 in this embodiment additionally includes a register 60 for controlling the step-down circuit 12. The value set to the register 60 is determined by the CPU 30.

In this embodiment, the internal power supply voltage VDD2, generated by the step-down circuit 12, is controlled in response to the value set to the register 60. In this embodiment, the internal power supply voltage VDD2 is decreased as the increase in the value set to the register 60. For example, the internal power supply voltage VDD2 is adjusted to be identical to the external power supply voltage VDD0 when the value set to the register 60 is "0", while the internal power supply voltage VDD2 is adjusted to be VDD0-0.2 V, and VDD0-0.4 V, when the value set to the register 60 is "1", and "2", respectively. Setting a value of "0" to the register 60 provides the soft error reduction effect to the same degree as the microcomputer operation described in the first embodiment. When the soft error problem is not so serious, on the other hand, the register 60 is set with a value of "2" to reduce the power supply voltage fed to the RAM 40. This effectively reduces the power consumption of the microcomputer 100.

As described above, the microcomputer 100, incorporating the step-down circuit 12 dedicatedly feeding the internal power supply voltage VDD2 to the RAM 40, is designed to control the internal power supply voltage VDD2 by the value set to the register 60. This allows adjusting the internal power supply voltage VDD2 in accordance with the application of the microcomputer 100.

Figure 7:
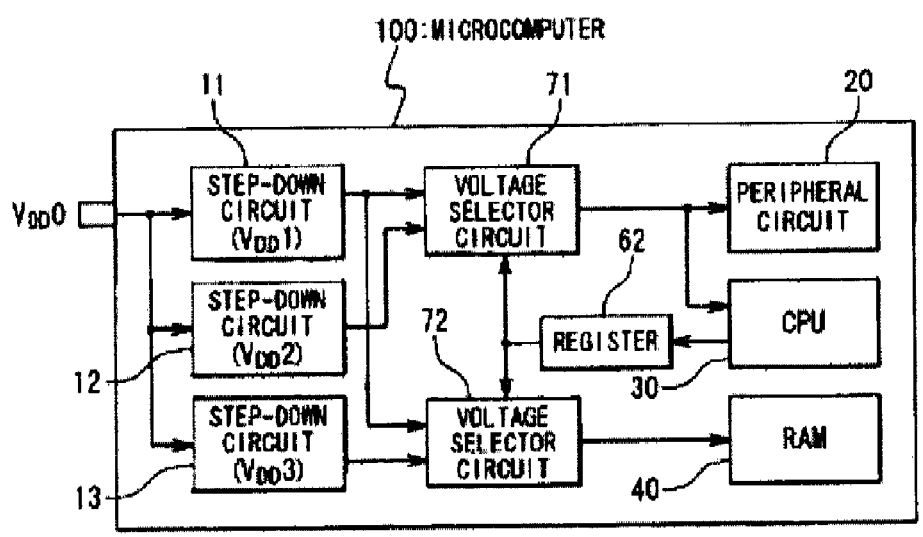
FIG. 7 is a block diagram illustrating the structure of a microcomputer in a fifth embodiment.

FIG. 7 illustrates the structure of a microcomputer 100 in a fifth embodiment of the present invention. In the fifth embodiment, the microcomputer 100 is provided with a set of three step-down circuits 11, 12, and 13, a peripheral circuit 20, a CPU 30, a RAM 40, a register 62, and a pair of voltage selector circuits 71 and 72. The step-down circuits 11, 12, and 13 are designed to generate internal power supply voltages by stepping down the external power source voltage VDD0 supplied to the microcomputer 100. The voltage selector circuit 71 selects a voltage fed to the peripheral circuit 20 and the CPU 30, while the voltage selector circuit 71 selects a voltage fed to the RAM 40. The register 60 is used to control the voltage selector circuits 71 and 72.

In this embodiment, there are two operation modes: a normal operation mode and a standby mode. The internal power supply voltages used in the microcomputer 100 depend on the operation mode of the microcomputer 100. The step-down circuit 11 generates an internal power supply voltage VDD1 which is used in the whole of the microcomputer 100 when the microcomputer 100 is placed in the normal operation mode. The step-down circuits 12 and 13 generate a set of internal power supply voltages VDD2 and VDD3 which is used in the microcomputer 100 when the microcomputer 100 is placed in the standby mode. The internal power supply voltages VDD1 to VDD3 satisfy the following relation:

VDD2<VDD3<VDD1.

In detail, when the microcomputer 100 is placed in the standby mode, the internal power supply voltage VDD2 is fed to the peripheral circuit 20 and the CPU 30, and the internal power supply voltage VDD3 is fed to the RAM 40.

The operation mode of the microcomputer 100 is switched by updating a value to the register 60 from the CPU 30. In one embodiment, the microcomputer 100 is placed in the normal operation mode, when the register 60 is set with a value of "0". When the register 60 is set with a value of "1", on the other hand, the microcomputer 100 is placed in the standby mode.

The voltage selector circuit 71 and 72 are responsive to the value set to the register 60 for selecting the output voltages thereof. The voltage selector 71 selects the voltage fed to the peripheral circuit 20 and the CPU 30 from the internal power supply voltages VDD1 and VDD2, while the voltage selector 72 selects the voltage fed to the RAM 40 from the internal power supply voltages VDD1 and VDD3.

When the microcomputer 100 is placed in the standby mode, the power supply voltages within the microcomputer 100 are reduced to reduce power consumption. The power supply voltages within the microcomputer 100 are as reduced as possible; however, excessive reduction in power supply voltages causes the soft error of the RAM 40. In one embodiment, the internal power supply voltage VDD2 is adjusted to the minimum voltage necessary for the standby, while the internal power supply voltage VDD3 is adjusted to the voltage level higher than that of the internal power supply voltage VDD2. Although the power consumption would be reduced most effectively when all the circuits within the microcomputer 100 are fed with the internal power supply voltage VDD2, the RAM 40, which suffers from an increased soft error rate compared with other circuits, is fed with the internal power supply voltage VDD3 to improve the soft error tolerance of the RAM 40.

In order to place the microcomputer 100 into the normal operation mode, the CPU 30 sets a value of "0" to the register 62. In response to the register 62 being set with the value "0", both of the voltage selector circuit 71 and 72 selects the internal power supply voltage VDD1. As a result, the CPU 30, the RAM 40 and the peripheral circuit 20 operate on the internal power supply voltage VDD1.

In order to place the microcomputer 100 into the standby mode, on the other hand, the CPU 30 sets a value of "1" to the register 62. In response to the register 62 being set with the value of "1", the voltage selector circuit 71 selects the internal power supply voltage VDD2 received from the step-down circuit 12, and the voltage selector circuit 72 selects the internal power supply voltage VDD3 received from the step-down circuit 13. As a result, the CPU 30, and the peripheral circuit 20 operate on the internal power supply voltage VDD2, while the RAM 40 operates on the internal power supply voltage VDD3.

Such operation effectively reduces the soft error rate during standby with reduced power consumption through feeding a relatively high power supply voltage to the RAM 40.

Figure 8:
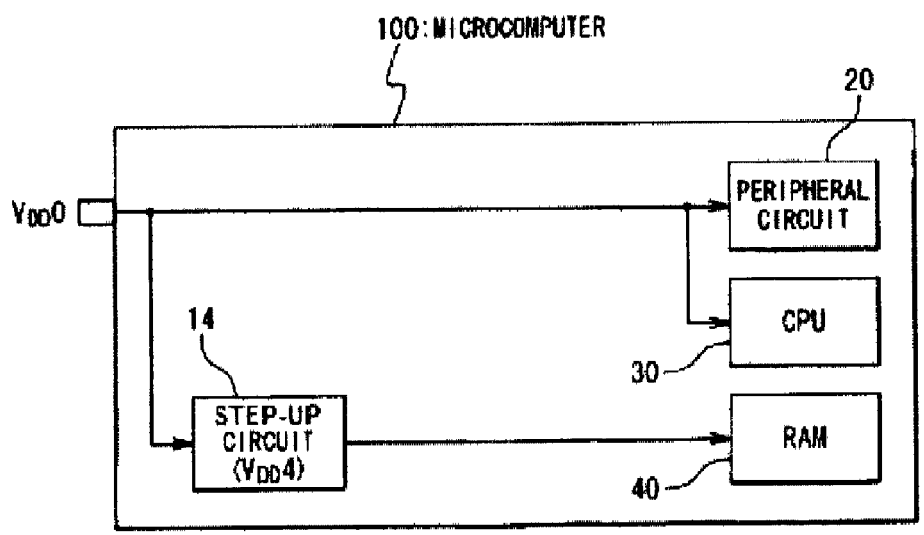
FIG. 8 is a block diagram illustrating the structure of a microcomputer in a sixth embodiment.

FIG. 8 illustrates the structure of a microcomputer 100 in a sixth embodiment of the present invention. In this embodiment, the microcomputer 100 operates on an external power supply voltage VDD0 that is stepped down by an external step-down circuit. The microcomputer 100 is provided with a step-up circuit 14, a peripheral circuit 20, a CPU 30 and a RAM 40. The step-up circuit 14 generates an internal power supply voltage VDD4 by boosting the external power supply voltage VDD0.

The step-up circuit 14, the peripheral circuit 20, and the CPU 30 are connected to a power source terminal receiving the external power source voltage VDD0. The RAM 40 is connected to the step-up circuit 14.

As shown in FIG. 8, the external power supply voltage VDD0 is fed to the CPU 30 and the peripheral circuit 20, and the internal power supply voltage VDD4, generated by the step-up circuit 14, is fed to the RAM 40.

The CPU 30 and the peripheral circuit 20 operate on the external power supply voltage VDD0, and the RAM 40 operates on the internal power supply voltage VDD4. It should be noted that the external power supply voltage VDD0 is lower than the internal power supply voltage VDD4.

The microcomputer 100 in this embodiment effectively reduces the soft error rate by boosting the power supply voltage fed to the RAM 40 to a higher voltage level than that of the power supply voltage fed to other circuits.

It is apparent that the present invention is not limited to the above-described embodiments, which may be modified and changed without departing from the scope of the invention.

For example, the power supply circuit generating the power supply voltage VDD0 may be incorporated within the microcomputer 100. Additionally, any of the power supply circuits that generate the power supply voltages VDD0, VDD1, VDD2, VDD3 and VDD4 may be externally provided outside of the microcomputer 100.

Although the suppression of the soft error of a memory device (the RAM 40 in the embodiments) is described in the embodiments, the power supply voltage to the CPU may be increased above that to the RAM when the soft error rate of the CPU is higher than that of the RAM.

Although the microcomputers are described in the embodiments, the present invention is applicable to not only a microcomputer but also, for example, a device having a plurality of internal circuits, at least one of which is more tolerant or susceptive to the soft error than another of the internal circuits. The present invention allows reducing the soft error by selectively feeding an internal circuit susceptive to the soft error with a power supply voltage higher than power supply voltages fed to other internal circuits.

As described above, in the present invention, a power supply voltage is fed to a certain internal circuit separately from other internal circuits. This allows adjusting the power supply voltage fed to the certain internal circuit (or increasing the power supply voltage fed to the certain internal circuit), independently of the other internal circuits. This effectively achieves reduction in the soft error rate with reduced power consumption.

What is claimed is:

1. A semiconductor device comprising:
   a first circuit receiving a first power supply voltage; and
   a second circuit receiving a second power supply voltage,
   wherein said second circuit is a memory device, and
   said second power supply voltage is higher than said first power supply voltage and is adjusted in accordance with a capacity of said memory device.

2. The semiconductor device according to claim 1, wherein further comprising:
   a step-down circuit generating said first power supply voltage through stepping down an external power supply voltage,
   wherein said external power supply voltage is also used as said second power supply voltage.

3. The semiconductor device according to claim 1, wherein further comprising:
   a first step-down circuit generating said first power supply voltage through stepping down an external power supply voltage,
   a second step-down circuit generating said second power supply voltage through stepping down said external power supply voltage.

4. A semiconductor device comprising:
   a first circuit receiving a first power supply voltage; and
   a second circuit receiving a second power supply voltage,
   wherein said second power supply voltage is higher than said first power supply voltage, and
   wherein said first circuit is more tolerant to a soft error than said second circuit.

5. The semiconductor device according to claim 4, wherein said second circuit is a memory device.

6. The semiconductor device according to claim 5, wherein said memory device includes:
   a first memory block fed with said first power supply voltage; and
   a second memory block fed with said second power supply voltage.

7. A semiconductor device according comprising:
   a first circuit receiving a first power supply voltage;
   a second circuit receiving a second power supply voltage;
   a first step-down circuit generating said first power supply voltage through stepping down an external power supply voltage;
   a second step-down circuit generating said second power supply voltage through stepping down said external power supply voltage; and
   a register,
   wherein said second power supply voltage is higher than said first power supply voltage,
   said first circuit include a CPU for setting a value to said register, and
   said voltage level of said second power supply voltage is controlled in response to said value set to said register.

8. A semiconductor device comprising:
   a first circuit receiving a first power supply voltage;
   a second circuit receiving a second power supply voltage;
   a first step-down circuit generating a first stepped-down voltage through stepping down an external power supply voltage;
   a second step-down circuit generating a second stepped-down voltage through stepping down said external power supply voltage, wherein said second power supply voltage is higher than said first power supply voltage;
   a third step-down circuit generating an third stepped-down voltage through stepping down said external power supply voltage;
   a first voltage selector circuit selecting one of said first and second stepped-down voltage as said first power supply voltage;
   a second voltage selector circuit selecting one of said first and third stepped-down voltage as said second power supply voltage; and
   a register,
   wherein said first circuit include an CPU for setting a value to said register,
   wherein said first and second voltage selector circuits select said first stepped-down voltage as said first and second power supply voltages, respectively, when said value set to said register is a first value,
   wherein, when said value set to said register is a first value, said first voltage selector circuit selects said second stepped-down voltage as said first power supply voltage, while said second voltage selector circuit selects said third stepped-down voltage as said second power supply voltage, and
   wherein said third stepped-down voltage is higher than said second stepped-down voltage.

9. A semiconductor device comprising:
   a first circuit receiving a first power supply voltage; and
   a second circuit receiving a second power supply voltage; and
   a step-up circuit generating said second power supply voltage by boosting an external power supply voltage,
   wherein said second power supply voltage is higher than said first power supply voltage.

* * * * *